(12) United States Patent
Brown et al.

(10) Patent No.: US 10,825,753 B2
(45) Date of Patent: Nov. 3, 2020

(54) SEMICONDUCTOR DEVICE AND METHOD OF MANUFACTURE

(71) Applicant: NEXPERIA B.V., Nijmegen (NL)

(72) Inventors: Adam R. Brown, Hazel Grove (GB); Ricardo L. Yandoc, Hazel Grove (GB)

(73) Assignee: Nexperia B.V., Nijmegen (NL)

( * ) Notice: Subject to any disclaimer, the term of this patent is extended or adjusted under 35 U.S.C. 154(b) by 54 days.

(21) Appl. No.: 16/162,523

(22) Filed: Oct. 17, 2018

(65) Prior Publication Data

US 2019/0122965 A1    Apr. 25, 2019

(30) Foreign Application Priority Data

Oct. 23, 2017   (EP) .................................... 17197800

(51) Int. Cl.
  *H01L 23/495*   (2006.01)
  *H01L 25/07*   (2006.01)
(52) U.S. Cl.
  CPC .. *H01L 23/49524* (2013.01); *H01L 23/49503* (2013.01); *H01L 23/49541* (2013.01); *H01L 23/49562* (2013.01); *H01L 23/49575* (2013.01); *H01L 25/072* (2013.01); *H01L 2224/0603* (2013.01)
(58) Field of Classification Search
  CPC ......... H01L 23/49524; H01L 23/49562; H01L 23/49575; H01L 23/49503; H01L 23/49541; H01L 25/072; H01L 2224/0603; H01L 24/80; H01L 23/49517; H01L 21/50
  See application file for complete search history.

(56) References Cited

U.S. PATENT DOCUMENTS

2002/0033541 A1* 3/2002 Uchida ............. H01L 23/49562
                                                                257/784
2012/0001308 A1* 1/2012 Fukutani ................. H01L 24/73
                                                                257/675

FOREIGN PATENT DOCUMENTS

JP    2011249364 A    12/2011
WO   2013118275 A1    8/2013

OTHER PUBLICATIONS

International Search Report and Written Opinion for corresponding European application EP17197800, dated Apr. 19, 2018, 7 pages.

* cited by examiner

*Primary Examiner* — John P. Dulka
(74) *Attorney, Agent, or Firm* — Ohlandt, Greeley, Ruggiero & Perle, L.L.P.

(57) ABSTRACT

The present disclosure relates to a semiconductor device and a method of manufacturing a semiconductor device. The semiconductor device including first and second semiconductor dies arranged on respective and first and second carriers, the first and second semiconductor dies each comprising a first contact and a second contact arranged on a top major surface of the respective semiconductor dies and a third contact arranged on a bottom major surface the respective semiconductor dies; first and second die connection portions, arranged on the respective first and second carriers, connected to the third contacts of the respective first and second semiconductor dies; and a first contact connection member, extending from the first contact of the first semiconductor die to the die connection portion of second carrier, electrical connection of the first contact of the first semiconductor die to the third contact of the second semiconductor die.

14 Claims, 7 Drawing Sheets

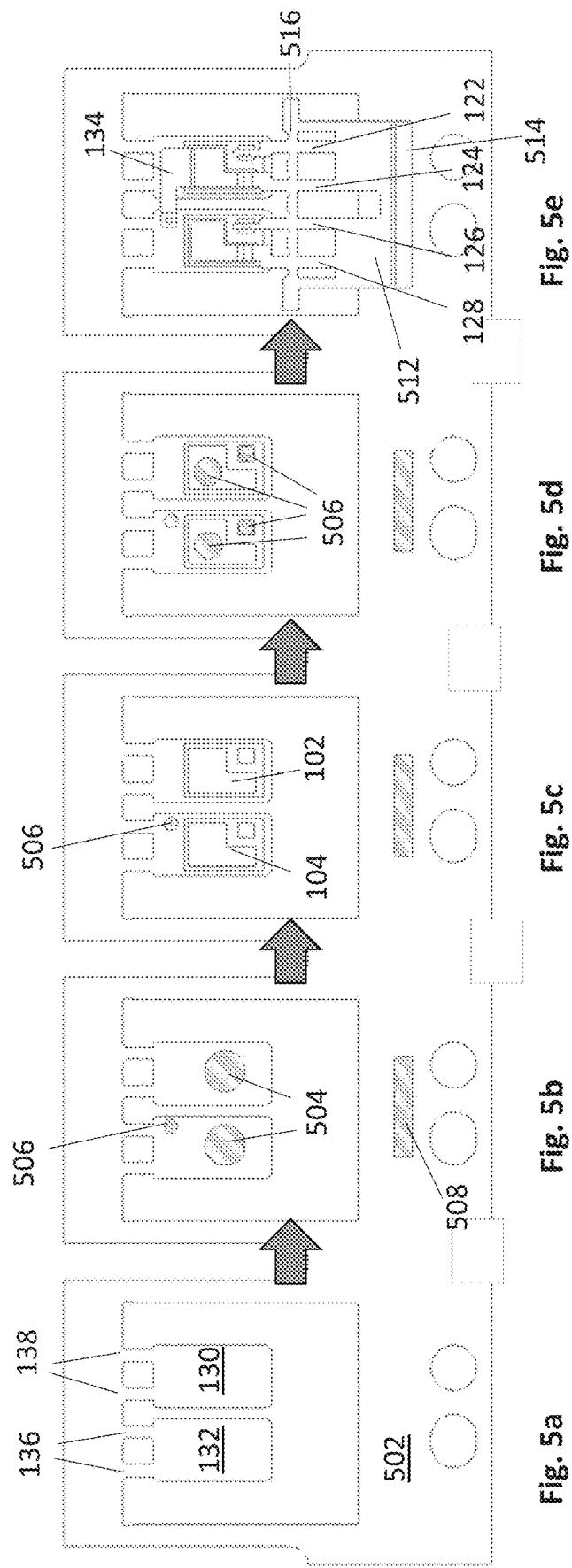

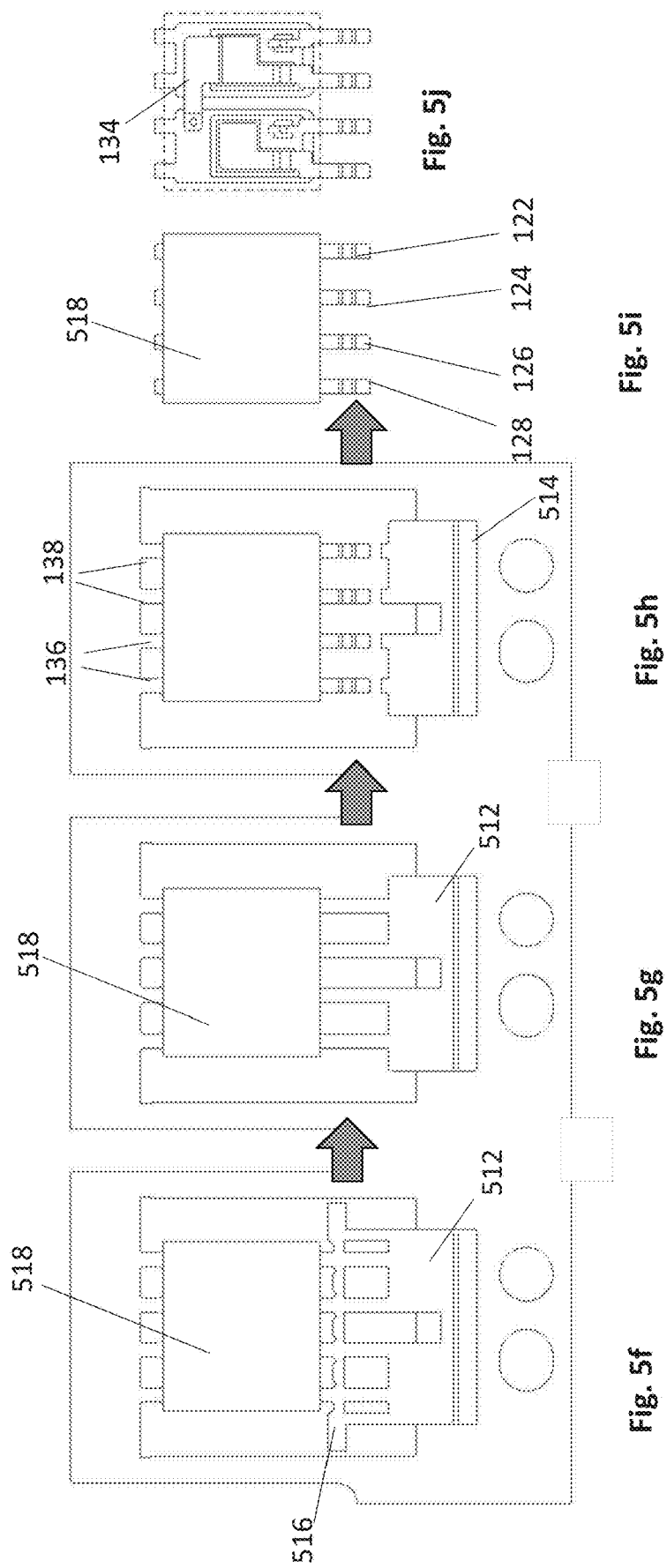

SEMICONDUCTOR DEVICE AND METHOD OF MANUFACTURE

CROSS REFERENCE TO RELATED APPLICATION

The present application claims foreign priority to European Patent Application No. 17197800.0 filed on Oct. 23, 2017 the entirety of which is incorporated by reference hereby.

BACKGROUND

The present disclosure relates to a semiconductor device and method of manufacture. In particular the present disclosure relates to a semiconductor device package, and method of manufacture, comprising at least two semiconductor dies.

Integrating two semiconductor dies into a single packaged semiconductor device can provide a significant reduction in device footprint compared to two separate semiconductor devices. The semiconductor dies may be transistors arranged, for example, in a half bridge configuration.

Where the transistors are field effect transistors for example, in the half-bridge configuration, it is necessary to connect the source of the first MOSFET to the drain of the second field effect transistor using an external connection, usually provided on the carrier or printed circuit board to which the ransistors are attached. This connection can create an inductive loop which can slow the switching of the devices.

Two separate transistor devices arranged in a half-bridge can take valuable board space and the connections from source to drain can also cause a large inductive loop and may slow the switching of the devices.

SUMMARY

According to embodiments, there is provided a semiconductor device comprising: first and second semiconductor dies arranged on respective and first and second carriers, the first and second semiconductor dies each comprising a first contact and a second contact arranged on a top major surface of the respective semiconductor dies and a third contact arranged on a bottom major surface of the respective semiconductor dies; first and second die connection portions, arranged on the respective first and second carriers connected to the third contacts of the respective first and second semiconductor dies; and a first contact connection member, extending from the first contact of the first semiconductor die to the die connection portion of second carrier, such that the first contact of the first semiconductor die is electrically connected to the third contact of the second semiconductor die.

According to embodiments, the first contact connection member may extend from the first contact of the first semiconductor die to form an external lead of the semiconductor device. The first contact connection member may be integrally formed with an external lead of the semiconductor device.

Optionally, a third connection member may extend from the first contact of the second semiconductor die to form a respective external lead of the semiconductor device.

Optionally, at least one connection portion may extend from each of the first and second carriers to form a respective external lead of the semiconductor device.

According to embodiments, the first contact connection member may be a lead clip comprising: a first portion for connection to the first contact of the first semiconductor die; a second portion for connection to the die connection portion of second carrier; and a conductive portion connecting the first portion with the second portion. The conductive portion may be raised with respect to the first portion and the second portion.

According to embodiments, the first and second semiconductor dies may be arranged as a half bridge circuit. The first and second semiconductor dies may be field effect transistors, and the first contacts may be source contacts; the second contacts may be gate contacts; and the third contacts may be drain contacts. The first semiconductor die may be a high side field effect transistor and the second semiconductor die may be a low side field effect transistor.

According to embodiments, the third contact connection member may be bifurcated.

According to embodiments there is provided a method of manufacturing a semiconductor device, comprising: mounting first and second semiconductor dies on respective first and second carriers, the first and second semiconductor dies each comprising a first contact and a second contact arranged on a top major surface of the respective semiconductor dies and a third contact arranged on a bottom major surface of the respective semiconductor dies; connecting first and second die connection portions on the respective first and second carriers connected to the third contacts of the respective first and second semiconductor dies; connecting a first contact connection member to extend from the first contact of the first semiconductor die, to the die connection portion of second carrier, electrical connection of the first contact of the first semiconductor die to the third contact of the second semiconductor die.

The first contact connection member may be connected to extend from the first contact of the first semiconductor die and the first contact connection member may be integrally formed with an external lead of the semiconductor device.

The first contact connection member and the external lead of the semiconductor device are integrally formed with a clip frame.

DESCRIPTION OF THE DRAWINGS

In the figures and the following description like reference numerals refer to like features.

The invention is described further hereinafter by way of example only with reference to the accompanying drawings in which:

FIG. 2b illustrates the equivalent circuit diagram of the half-bridge configuration of FIG. 2a;

FIGS. 5a to 5j illustrate a process flow for manufacturing a semiconductor device according to embodiments.

Figure 1:
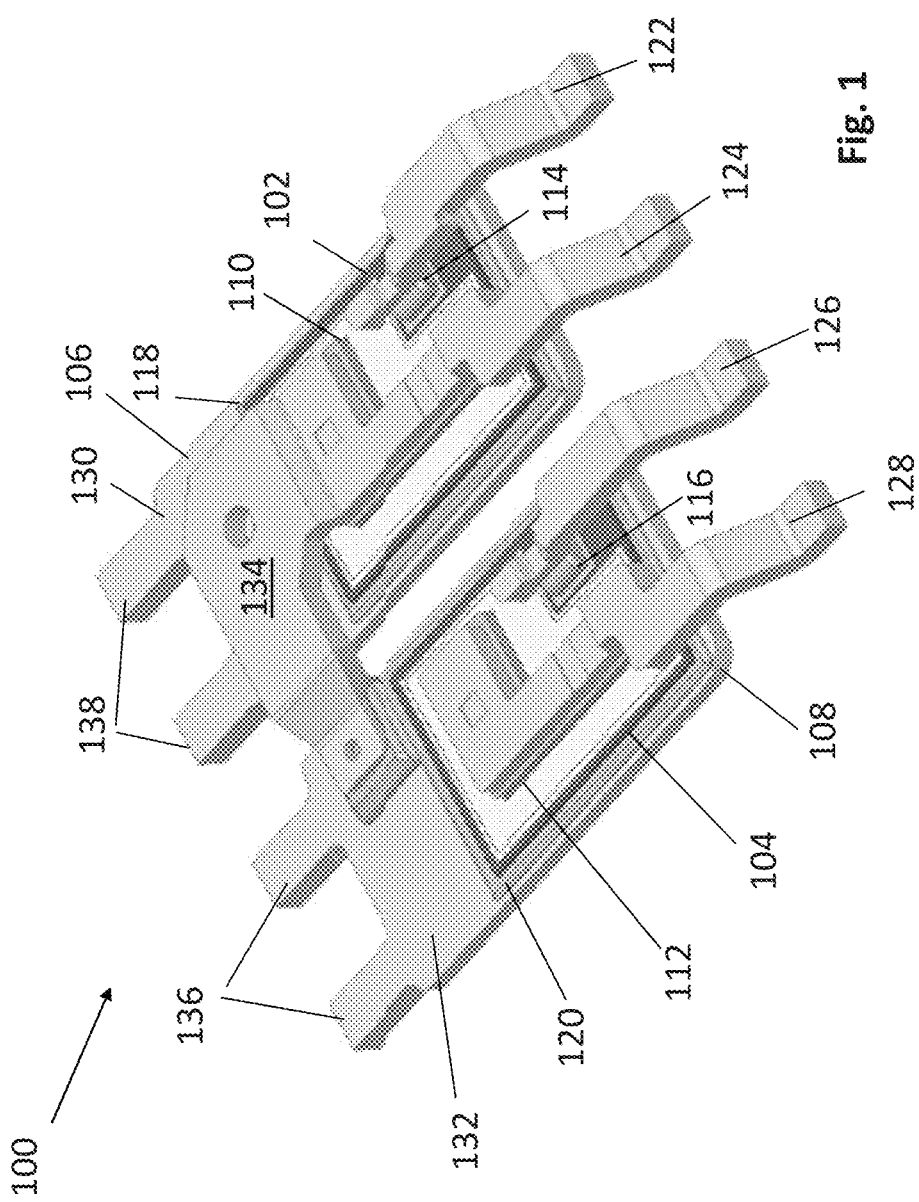
FIG. 1 illustrates a semiconductor device according to embodiments.

The semiconductor device 100 according to embodiments is illustrated in FIG. 1. The semiconductor device 100 comprises a first semiconductor die 102 arranged on first carrier 106 and a second semiconductor die 104 arranged on a second carrier 108. The first and second semiconductor dies 102, 104 may each comprise a first device contact 110, 112 and a second device contact 114, 116 arranged on a top is major surface thereof. The first and second semiconductor dies 102, 104 may each comprise a third device contact 118, 120 arranged on a bottom major surface thereof. The top major surface of the first and second semiconductor dies 102, 104 opposes the respective bottom major surface. The semiconductor dies 102, 104 may have substantially the same dimensions.

The first and second semiconductor dies 102, 104 may be fixedly arranged or mounted on the respective first and second carriers 106, 108 using any appropriate means such as an adhesive, a conductive adhesive or a solder, to allow an electrical connection between the third device contact 118, 120 and the respective first and second carriers 106, 108.

The carriers 106, 108 may be conductive carriers, formed of for example copper, and may each include a die attach or connection portion, such as a die pad suitable for fixedly mounting the first and second semiconductor dies 102, 104 to the respective carriers 106, 108.

A connection member 134, may be arranged to electrically connect the first device contact 110 of the first semiconductor die 102 to the second carrier 108. As described above, the third contact 120 of the second semiconductor die 104 may be electrically connected to the second carrier 108 using a conductive adhesive or solder and as a result of this electrical connection the third electrical contact 120 will be electrically connected to the first device contact 110 of the first semiconductor die 102 by the connection member 134.

The connection member 134 may be fixedly attached at a first end to the second carrier 108 by any appropriate means such as a conductive adhesive or solder or welding. The connection member 134 may be fixedly attached at a second end, distal the first end, to the first contact 110 of the first semiconductor die 102 by any appropriate means such as a conductive adhesive or a solder. A portion of the connection member 134, between the first end, contacting to the second carrier 108, and the second end, contacting the first contact of the first semiconductor die 102, may be higher than the first and second ends. In this regard the connection member may be considered to comprise an intermediate portion that is higher than the respective first and second ends. This ensures that the connection member does not contact any other part of the first and second carriers or first and second dies other than at the first and second ends of the conductive member, as mentioned above.

The conductive member 134 may comprise an optional further lead portion 124 which extends in a direction away from the first contact 110 of the first semiconductor die 102. The optional further lead portion 124 may form an external contact or lead of the semiconductor device 100, suitable for connection to a carrier such as a printed circuit board, by way of the connection to the first semiconductor die 102 by the first contact 110. The conductive member 134 and the lead portion may be formed of single piece of conductive material. Alternatively, the conductive member may be joined to the lead portion at any appropriate point, such as for example the first contact 110, by for example soldering, welding or a conductive adhesive. In addition to the electrically functionality described above, the conductive member 134 may also serve to hold the first semiconductor die in position on the first carrier by the application of a downward pressure applied by the carrier to the die. This may prevent the die from tilting or moving during fabrication of the semiconductor device 100, or from tilting or moving following fabrication. This is particularly advantageous where the semiconductor device 100 is qualified for automotive applications.

The semiconductor device 100 may further comprise second contact connection members 122, 126 extending from the respective second contacts 114, 116 of the first and second semiconductor dies 102, 104. At a first end, the second contact connection members 122, 126 may be electrically connected to the second contacts 114, 116 by any appropriate means such as a conductive adhesive or solder. At a second end distal the first end, the second contact connection members 122, 126 may form external electrical contact or leads to the semiconductor device and may be suitable for connection to a carrier such as a printed circuit board (not illustrated).

The semiconductor device 100 may further comprise a third contact connection member 128 extending from the first contact 112 of the second semiconductor die 104. At a first end, the third contact connection member 128 may be electrically connected to the first contact 112 by any appropriate means such as a conductive adhesive or solder. At a second end, distal the first end, the third contact connection member 128 may form external electrical contact or leads to the semiconductor device and may be suitable for connection to a carrier such as a printed circuit board (not illustrated).

Each of the carriers 106, 108 may also include one or more leads 136, 138 extending therefrom. At a first end, the leads may be integrally formed with a respective carrier 106, 108. At a second end distal the first end, the leads may form external electrical contacts to the respective third contacts of the first and second semiconductor dies. In addition, the leads 136 of the second carrier 108, and thus the third contact 112 of the second semiconductor die 104, may be connected to the first contact of the first semiconductor die by the conductive member 134. The leads 138, 136 and may be suitable for connection to a carrier such as a printed circuit board (not illustrated).

The connection member 134 and the further lead 124 may be arranged as a so-called lead clip and may be formed of an electrically and thermally conductive material. As a result, the connection member may serve as both an electrical connection from the first contact 110 to the second carrier 108 and a heat sink from the first semiconductor die 102 to the second carrier. This is particularly advantageous because the connection member 134 connects to the carrier 132 allowing heat to be transferred from the first semiconductor die 102 to the second carrier 132 allowing for efficient heat dissipation from the first semiconductor die 102. Additionally, the second contact connection members 122, 126 and the third contact connection member 128 may also be arranged as lead clips.

The first contacts 110, 112, second contacts 114, 116 and third contacts 118, 120 may be arranged on the respective first and second semiconductor dies by any appropriate metallisation process. The aforementioned contacts may be arranged such that they can be electrically and mechanically connected to the aforementioned connection members using a conductive adhesive or solder.

It should be noted that the connection member 134 may be contained within the foot-print of the semiconductor device 100. FIG. 1 illustrates a final semiconductor device 100, however, for clarity and ease of illustration, any packaging such as moulding or encapsulation is not illustrated. For a packaged semiconductor device, the connection member 134 is embedded in the package material (not illustrated) and will not extend outside the finally packaged semiconductor device 100. This is more clearly illustrated in the plan view of the semiconductor device 100 in FIG. 2a (again for clarity the moulding or encapsulation is not illustrated).

The first, second and third connection members may form external leads and may be arranged in any suitable pin configuration such as surface mount dual-in-line packages of which LFPAK is just one of a number of examples.

Figure 2B:
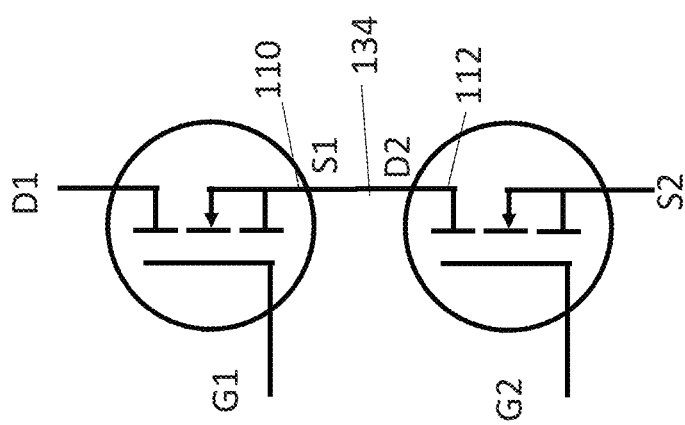
Figure 2A:
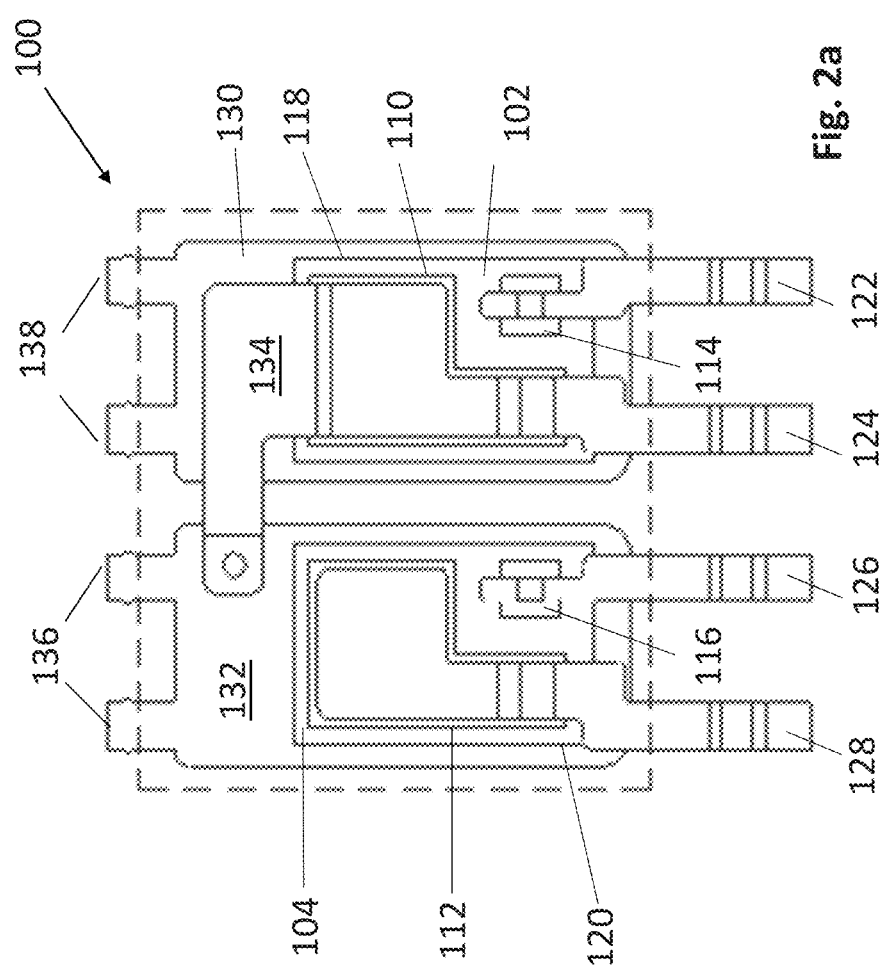
FIG. 2a illustrates a plan view of semiconductor device according to embodiments arranged in half-bridge configuration.

In an embodiment, the first and second semiconductor dies 102, 104 may be field effect transistors (FET) and referring to FIG. 2a the semiconductor dies 102, 104 may be arranged in a half-bridge configuration, whereby the first semiconductor die 102 is a high-side FET and the second semiconductor die 104 is a low-side FET. The first contacts 110, 112 may be source contacts, the second contacts 114, 116 may be gate contacts and the third contacts 118, 120 may be drain contacts. Therefore, following the discussion above with respect to FIG. 1, the half-bridge configuration, as shown in the equivalent circuit of FIG. 2b, is achieved by a connection of the first contact 110 (namely, the high side source) to the third contact 112 (namely, the low side drain) using the connection member 134. In this way, the half-bridge connection of high side source S1 to the low side drain D2, illustrated in FIG. 2b is obtained.

In the half-bridge configuration of FIG. 2b, the external leads of the semiconductor device are arranged as follows. The high-side drain D1 is formed of leads 138 and whilst FIG. 1 and FIG. 2a illustrate more than one lead 138, the skilled person will appreciate that any number of leads may be provided. The high-side gate G1 is formed by lead 122 and the low-side gate G2 is formed by lead 126 and the low-side source S2 is formed by lead 128. As discussed, the connection member connects 134 the high-side source contact to the low-side drain, via the carrier 132 connected to the low side drain contact 120. Whilst FIG. 1 and FIG. 2a illustrate external low-side drain D2 leads 136, the skilled person will appreciate that they are not strictly required in half-bridge configuration due to the connection of high-side source contact to the low-side drain.

In half-bridge configuration, the low-side drain D2 leads 136, or the point where the connection member 134 connects to the carrier 132, acts as a mid-point node between the high side 102 and the low side 104 semiconductor dies. If the high side is switched on (and the low side is off) by application of a voltage at the terminal 122, a current can flow from the high side drain 138 through the high side die to the drain 136, via the connection member 134. Conversely, if the low side is switched on (and the high side is off) by application of a voltage at the terminal 126, a current can flow from low side source 128 to low-side 136. In addition and as discussed above with respect to FIG. 1 above, the connection member 134 may extend to include an additional lead 124 which may form the high side source S1 connection and such a connection may be used as switch node or as a gate drive pin. The current carrying capacity of lead 124 may be smaller than that of low side drain D2 lead 136 and as such it may not be used for application of a voltage. Advantageously, it may be used to monitor the source of the high side die 102 which is use for fast switching of the high side die. In addition, the gate source voltage of the high side die 102 may be accurately applied without causing parasitic inductances. Also, it is noted that the connection member 134 is contained within the semiconductor device 100 footprint.

As a result of the connection member 134 arranged as discussed above, the arrangement of the present disclosure does not require flip chip die arrangements which are difficult to align and achieve zero part per million quality as required by the Automotive industry.

Whilst the above discussion refers to a half-bridge configuration the skilled person will appreciate that it is equally relevant to cascode arranged semiconductor devices such as a normally-on, or depletion, mode transistor such as a JFET configured to be switched by a normally off, or enhancement mode, transistor such as a MOSFET. In addition, the arrangements discussed above are also equally applicable to bipolar transistors.

In an embodiment, the first and second semiconductor dies 102, 104 may be bipolar junction transistors (BJT) arranged in a half-bridge configuration whereby the first semiconductor die is a high-side BJT and the second semiconductor die is a low-side BJT. The first contacts 110, 112 may be emitter contacts, the second contacts 114, 116 may be base contacts and the third contacts may be collector contacts 118, 120. Therefore, following the principles discussed above with respect to FIG. 1, the half-bridge configuration may be achieved by a connection of the first contact 110 of the first semiconductor die 102 (in this case the emitter of the high-side BJT) to the third contact 120 of the second semiconductor die 104 (in this case the collector of the low so side BJT) using the connection member 134. In this way, the half-bridge connection of high-side emitter to low-side collector is obtained.

Figure 3B:
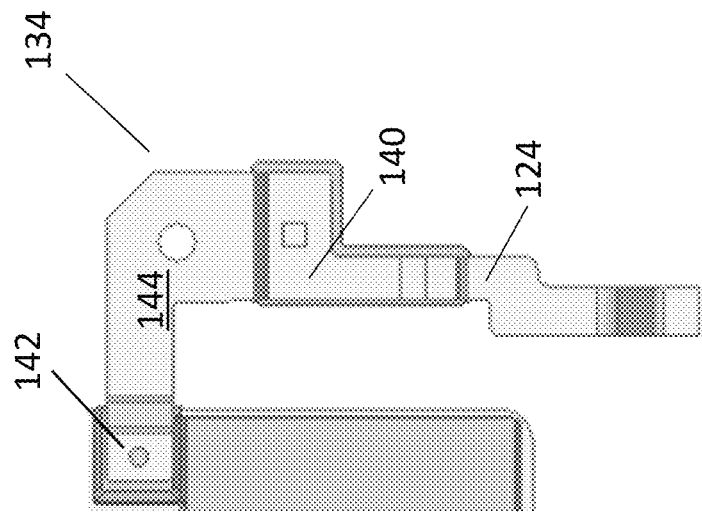
FIG. 3b illustrates a further example embodiment of a connection member.
Figure 3A:
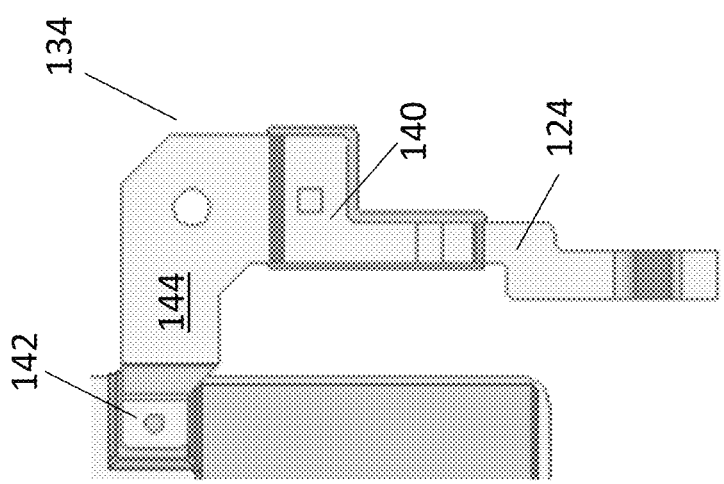
FIG. 3a illustrates an example embodiment of a connection member.

FIGS. 3a and 3b illustrate example embodiments of the connection member 134. The connection member 134 is generally formed of three portions. Firstly, the connection member may comprise a die attach portion 140 for connection to an electrical contact of a semiconductor die, such as the first contact 110 of the first semiconductor die 102, following the examples presented above. Secondly, the connection member may comprise a contact portion 142 for connecting to a carrier, such as the carrier 132, following the examples above. Thirdly, an interconnection portion 144 is arranged to electrically and mechanically connect the die attach portion 140 to the contact portion 142. The die attach portion 140 may be dimensioned to match the dimensions of the electrical contact of the semiconductor die so as to ensure secure electrical and mechanical contact there to. The contact portion 142 may be any appropriate dimension as required to contact to a carrier. The interconnection portion 144 may be any appropriate dimension to carry current from the die attach portion 140 to the contact portion 142, and generally, the larger the current flow the larger the dimension of the interconnection portion 144. FIGS. 3a and 3b show two examples of an interconnection portion 144. In the example of FIG. 3a the interconnection portion is wider than that shown in FIG. 3b. Consequently, the interconnection portion of FIG. 3a can carry more current than that of FIG. 3b. In addition, the wider interconnection portion 144 will have increased thermal mass and may thus act as more efficient heat sink when compared to a narrower interconnection portion 144. Optionally, and as discussed above, the connection member 134 may further comprise a lead portion 124 forming an external contact or lead of the semiconductor device 100 suitable for connection to a carrier such as a printed circuit board.

The connection member 134 may be formed of any appropriate material such as copper and may be stamped from a sheet of such material such that it is formed as a single piece. The optional lead portion 124 may be integrally formed with the connection member 134 or it may be formed as a separate piece and later connected, either mechanically and/or electrically to the connection member 134. The lead portion 124 may function as a switch node or as a gate drive pin as described above.

The geometry of the connection member 134 arranged such that the interconnection portion 144 is higher than the die attach portion 140 and the contact portion 142. This ensures that the connection member 134 isolated from the semiconductor die, other than at the die attach portion 140, and any of the surrounding features of the semiconductor device.

Figure 4A:
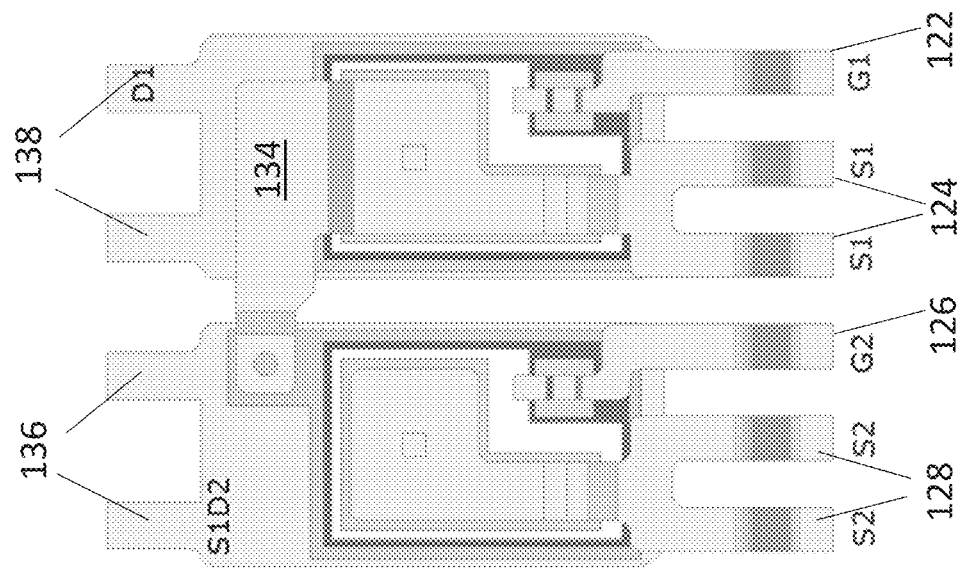
FIG. 4a illustrates an example embodiment of external lead arrangements of the semiconductor device.
Figure 4B:
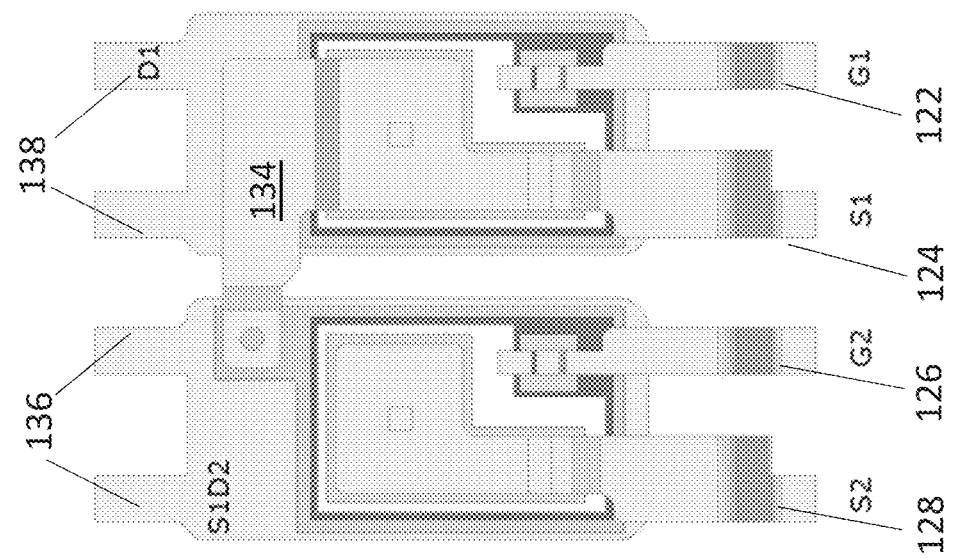
FIG. 4b illustrates a further example embodiment of external lead arrangements of the semiconductor device.

FIGS. 4a and 4b illustrate example embodiments of lead arrangements. In FIG. 4a, the third contact connection member 128 and/or the lead portion 124, may, when compared to the embodiments described above have an increased volume. This allows for increased current carrying capacity as the volume of the conductor is increased. This may be particularly advantageous in half-bridge configurations where the current flowing through for example the low side source S2 will be larger. Similarly, in FIG. 4b the third contact connection member 128 and/or the lead portion 124 may be forked or bifurcated again allowing for increased current carrying capacity through increase volume of the conductor.

FIGS. 5a to 5j illustrate an example steps in a process flow for manufacturing a semiconductor device 100 according to an embodiment. The process begins with a plurality of die pads 130, 132 connected to a frame 502 by a plurality of connections 136, 138 as show in FIG. 5a. The die pads 130, 132, frame 502 and plurality of connections 136, 138 may be formed of a single piece of conductive material such a sheet metal. The metal may be copper, for example. As illustrated in FIG. 5b a conductive adhesive 504, such as solder may be dispended on the die pads and lead frame. The attach conductive adhesive 504 may be arranged on the die pads for fixedly mounting the first 102 and second 104 semiconductor dies on the respective die pads as shown in FIG. 5c. Similarly, a conductive adhesive 506 may be dispensed on the die pad 132 for attaching the conductive member 134 (as illustrated in FIG. 5e, discussed below). A further conductive adhesive 508 may be dispensed on the frame 502 for attaching a lead clip (as illustrated in FIGS. 5b to 5d and discussed below).

As illustrated in FIG. 5c, the semiconductor dies 102, 104 are placed on the die attach conductive adhesive 504 material of the respective die pads 130, 132. Following placement of the dies a conductive adhesive 506 is arranged on the respective contacts 110, 112, 114, 116 of the dies semiconductor dies 102, 104 as illustrated in FIG. 5d.

Following the arrangement of the conductive adhesive on the contacts of the semiconductor dies, a clip frame 512 is arranged on the contacts of the semiconductor dies, the frame 502 and the die pad 132. The clip frame 512 may include a clip attach portion 514 for connecting to the conductive adhesive dispensed on the frame 502. A plurality of connection members 122, 124, 126, and 128 may be integrally formed with and extend away from the clip attach portion 514 to form connection members or leads of the device. The leads may form the connections to the contacts of the respective first and second dies. In the case of lead 124 this may further extend away from the lead attach portion to integrally form the connection member 134, as described above. The connection member may be configured to contact the conductive adhesive on the die pad. Optionally, a dambar may be integrally formed with the leads and extend transversely across the leads.

When the clip frame is arranged on the contacts of the semiconductor dies, the frame 502, and the die pad 132, the conductive adhesive may be cured to fixedly mount the clip frame thereto. Where the conductive adhesive is a solder, a process known as reflow may be used to fix the semiconductor dies 102, 104 to the die pads and to fix the clip frame to the contacts of the semiconductor dies, the frame 502 and the die pad 132. Curing or reflow ensures that the appropriate electrical and mechanical connections are formed in the semiconductor device, in accordance with embodiments described above.

Following placement of the clip frame 512, the semiconductor dies may be moulded or encapsulated in a protective packaging 518 as shown in FIG. 5f. FIG. 5g illustrates the removal of the dam bar 516, followed by cutting of the lead attach 514 to allow for processing of the leads in FIG. 5h. Following lead processing and formation, the semiconductor device 100 is singulated from the frame 502 by cutting the connection of the leads 136, 138 to the frame 502 as illustrated in FIG. 5i. The final semiconductor device 100 showing the protective packaging 518 removed for clarity is illustrated in FIG. 5j.

Figure 6:
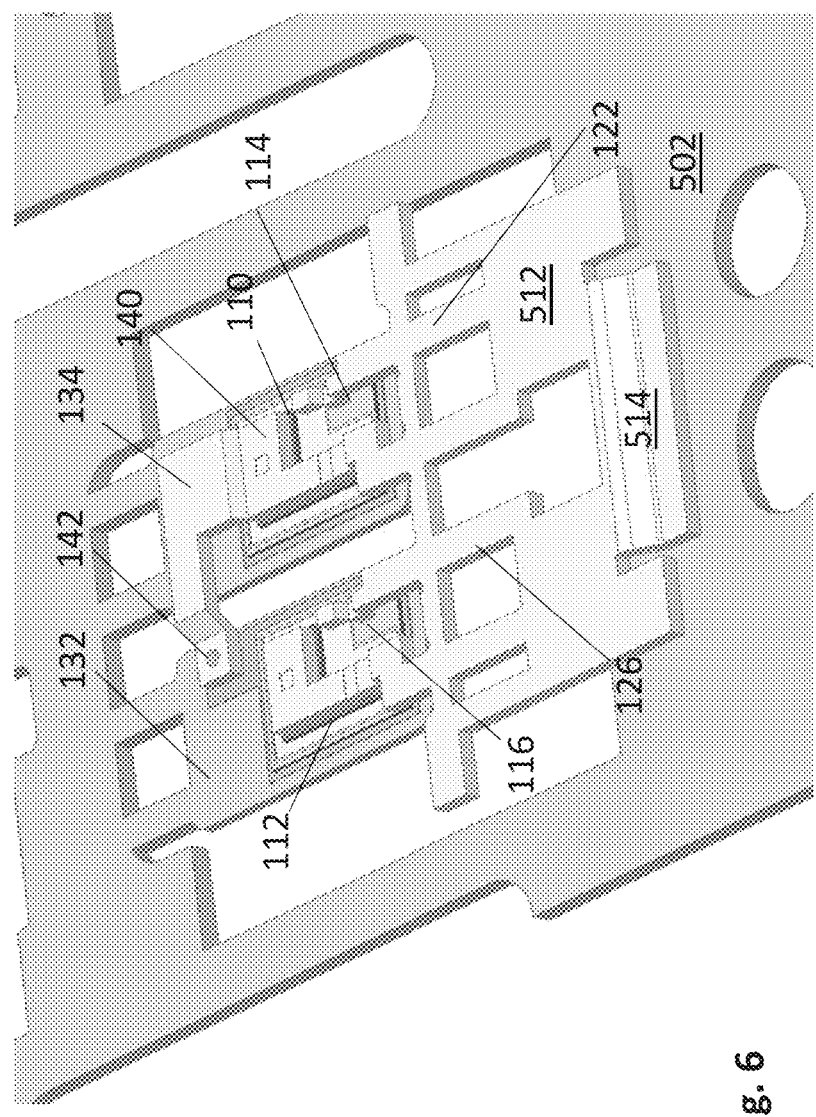
FIG. 6 illustrates a clip arrangement mounted on a frame and connected to two semiconductor dies.

According to embodiments, manufacturing of the semiconductor device 100 is simplified by placement of a single clip frame 512, shown in more detail in FIG. 6. Manufacturing the semiconductor device 100 in this way ensures that the first semiconductor die 102 is securely held in place on its respective carrier 130 by; fixing the clip frame 512 to the frame 502 at the clip attach portion 514; fixing the die attach portion 140 of the connection member 134 to the first semiconductor die 102; and fixing the contact portion 142 to the carrier 132. In addition, the second semiconductor die 104 is fixed to its respective carrier 132 by a combination of fixing the clip frame 512 to the frame 502 at the clip attach portion 514 and fixing third contact connection member 128 to the second semiconductor die 104. Furthermore, the connection members 122, 126 are contacted to respective first and second dies. This results in contacts to the semiconductor dies 102, 104 being in the same plane, that is having good co-planarity. The above arrangement of contacts and connections may therefore prevent the semiconductor dies from tilting during for example the reflow process discussed above. This is particularly advantageous where the semiconductor device is qualified for automotive applications.

Particular and preferred aspects of the present disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present disclosure. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

The invention claimed is:

1. A semiconductor device comprising:
   a first semiconductor die and a second semiconductor die arranged on respective ones of a first carrier and a second carrier, the first semiconductor die and the second semiconductor die each comprising a first contact and a second contact arranged on a top major surface of each of the first semiconductor die and the second semiconductor die and a third contact arranged on a bottom major surface of each of the first semiconductor die and the second semiconductor die;
   a first die connection portion and a second die connection portion arranged on the first carrier and the second carrier, respectively connected to the each of the third contacts of the first semiconductor die and the second semiconductor die; and
   a first contact connection member, extending from the first contact of the first semiconductor die to the second die connection portion of second carrier, so that the first contact of the first semiconductor die is electrically connected to the third contact of the second semiconductor die, the first contact connection member comprising:
      a first portion for connection to the first contact of the first semiconductor die;
      a second portion for connection to the second die connection portion of second carrier; and
      a conductive portion connecting the first portion with the second portion, wherein the conductive portion has a top surface that is raised with respect to a top surface of the first portion and a top surface of the second portion.

2. The semiconductor device of claim 1, wherein the first contact connection member extends from the first contact of the first semiconductor die to form an external lead of the semiconductor device.

3. The semiconductor device of claim 2, wherein the first contact connection member is integrally formed with the external lead of the semiconductor device.

4. The semiconductor device of claim 2, further comprising: a second contact connection member extending from each of the respective second contacts of the first semiconductor die and the second semiconductor die to form respective external leads of the semiconductor device.

5. The semiconductor device of claim 4, further comprising: a third contact connection member extending from the first contact of the second semiconductor die to form a respective external lead of the semiconductor device.

6. The semiconductor device of claim 5 wherein the third contact connection member is bifurcated.

7. The semiconductor device of claim 1, further comprising at least one connection portion extending from each of the first carrier and the second carrier to form a respective external lead of the semiconductor device.

8. The semiconductor device of claim 1, wherein the first contact connection member is a lead clip.

9. The semiconductor device of claim 1, wherein the first semiconductor die and the second semiconductor die are arranged as a half bridge circuit.

10. The semiconductor device of claim 1, wherein the first semiconductor die and the second semiconductor die are field effect transistors, and wherein:
    the first contacts are source contacts;
    the second contacts are gate contacts; and
    the third contacts are drain contacts.

11. The semiconductor device of claim 10, wherein the first semiconductor die is a high side field effect transistor and the second semiconductor die is a low side field effect transistor.

12. A method of manufacturing a semiconductor device, comprising:
    mounting a first semiconductor die and a second semiconductor on respective ones of a first carrier and a second carrier, the first semiconductor die and the second semiconductor die each comprising a first contact and a second contact arranged on a top major surface of each of the first semiconductor die and the second semiconductor die and a third contact arranged on a bottom major surface of each of the first semiconductor die and the second semiconductor die;
    connecting each of a first die connection portion and a second die connection portion on respective ones of a first carrier and a second carrier connected to each of the third contacts of the respective first semiconductor die and the second semiconductor die;
    connecting a first contact connection member to extend from the first contact of the first semiconductor die to the second die connection portion of the second carrier to form an electrical connection of the first contact of the first semiconductor die to the third contact of the second semiconductor die, the first connection member comprising:
       a first portion for connection to the first contact of the first semiconductor die;
       a second portion for connection to the second die connection portion of second carrier; and
       a conductive portion connecting the first portion with the second portion, wherein the conductive portion has a top surface that is raised with respect to a top surface of the first portion and a top surface of the second portion.

13. The method according to claim 12, wherein the wherein the first contact connection member is connected to extend from the first contact of the first semiconductor die and the first contact connection member is integrally formed with an external lead of the semiconductor device.

14. The method according to claim 13, wherein the first contact connection member and the external lead of the semiconductor device are integrally formed with a clip frame.

* * * * *